United States Patent [19]

Hollstein et al.

[11] Patent Number: 4,871,929

[45] Date of Patent: Oct. 3, 1989

[54] ECL LOGIC GATE

[75] Inventors: Roger L. Hollstein, Phoenix; M. Ngheim Phan, Mesa, both of Ariz.

[73] Assignee: Motorola Inc., Schaumburg, Ill.

[21] Appl. No.: 215,978

[22] Filed: Jul. 7, 1988

[51] Int. Cl.[4] .............. H03K 19/013; H03K 19/086; H03K 19/092; H03K 17/04

[52] U.S. Cl. .................................. 307/455; 307/475; 307/362

[58] Field of Search ............... 307/455, 355, 358, 359, 307/362, 363, 296.6, 475, 264; 323/315, 316, 317

[56] References Cited

U.S. PATENT DOCUMENTS 3,766,406  10/1973  Bryant et al. .................. 307/475
4,578,602   3/1986  West et al. ...................... 307/264 X
4,609,837   9/1986  Yagyuu et al. ................. 307/455
4,644,194   2/1987  Birrittella et al. .............. 307/455 X
4,771,190   9/1988  Umeki .............................. 307/455

Primary Examiner—Stanley D. Miller
Assistant Examiner—David R. Bertelson
Attorney, Agent, or Firm—Michael D. Bingham

[57] ABSTRACT

An ECL logic gate includes an input stage, an output stage, and a multifunction current mirror circuit. The input stage includes a plurality of input transistors, a reference transistor, and an output which indicates the relative conductivities of said reference transistor as compared to one or more of the input transistors. This output is coupled to the output stage. A current mirror circuit having first and second current paths is provided in which the input stage is coupled in series with the first current path, and the output stage is coupled in series with the second current path.

5 Claims, 1 Drawing Sheet

ECL LOGIC GATE

BACKGROUND OF THE INVENTION

This invention relates generally to logic circuitry and, more particularly, to an ECL logic gate employing a multifunction current mirror circuit.

A known ECL logic gate includes a current sourced emitter follower output and a current mirror circuit to develop the logic gate's switching current. In this case, three separate current paths are utilized, one of which comprises of a resistor and a diode coupled NPN transistor coupled in series between $V_{CC}$ (typically ground) and $V_{EE}$ (typically $-5.2$ volts). Thus, current always flows in this current path increasing the gates power consumption. While this may not be of great concern on a per gate basis, the unwanted power consumption becomes significant when the gate is used on gate arrays which may include over 10,000 gates. Furthermore, if the per gate component count can be reduced, there is a significant savings in die area on the entire array.

SUMMARY OF THE INVENTION

It is an object of the present invention to provide an improved ECL logic gate.

It is a further object of the present invention to provide an ECL logic gate employing a multifunction current mirror circuit.

It is a still further object of the present invention to provide an ECL logic gate which utilizes less power and fewer components thereby rendering it more suitable for use on gate arrays.

According to a broad aspect of the invention there is provided a logic gate comprising an input stage having a plurality of inputs and a first output; an output stage coupled to said first output; and current mirror means having first and second current paths for producing in said first current path a current which is a function of the current flowing in said second current path, said input stage coupled in series with said first current path, and said output stage coupled in series with said second current path.

The above and other objects, features, and advantages of the present invention will be more clearly understood from the following detailed description taken in conjunction with the accompanying drawings, in which:

DESCRIPTION OF THE PREFERRED EMBODIMENT

Figure 1:
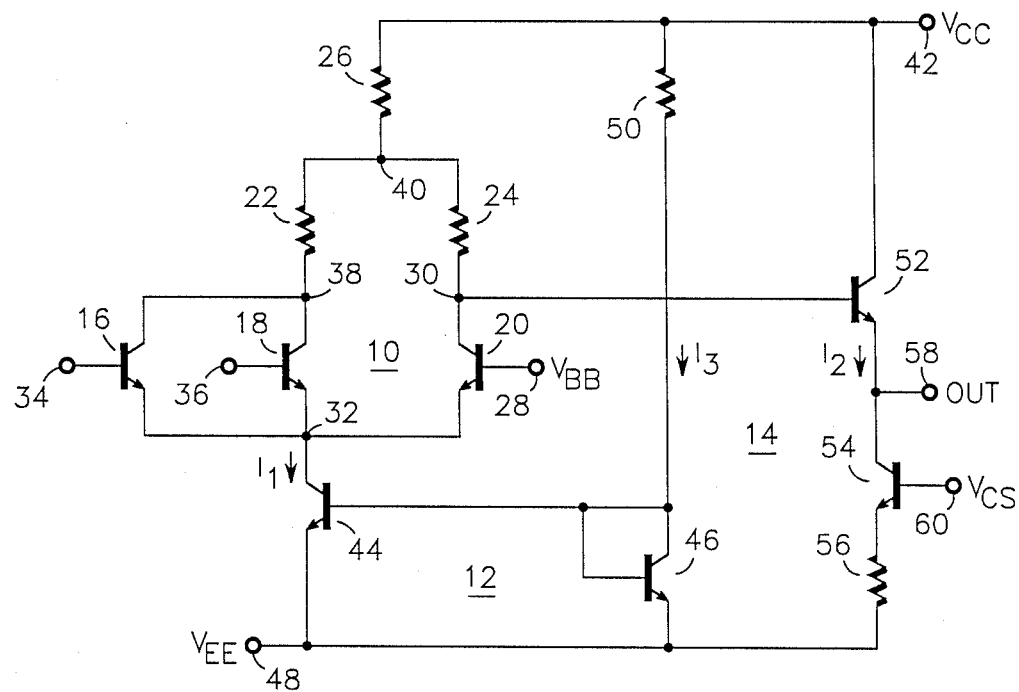
FIG. 1 is a schematic diagram of an ECL logic OR gate in accordance with the prior art.

Referring to FIG. 1, there is shown a schematic diagram of a prior art logic gate including an input stage 10, a current mirror circuit 12, and an output stage 14.

Input stage 10 includes first and second NPN input transistors 16 and 18, a reference transistor 20, and first, second and third resistors 22, 24, and 26. Input transistor 20 has a base coupled to terminal 28 which may in turn be coupled to a source of a reference voltage VBB (typically $-1.3$ volts). The collector of reference transistor 20 is coupled to node 30, and the emitter of reference transistor 20 is coupled to node 32. Input transistors 16 and 18 each have base electrodes coupled to input terminals 34 and 36 respectively. The collectors of input transistors 16 and 18 are coupled to node 38, and the emitters of transistors 16 and 18 are coupled to node 32. Resistor 22 is coupled between node 38 and node 40, and resistor 24 is coupled between node 30 and node 40. Resistor 26 is coupled between node 40 and power supply terminal 42 which may be coupled to a first source of supply voltage ($V_{CC}$). It should be clear that this input circuit functions as a two input OR gate with terminals 34 and 36 representing the first and second inputs and node 30 representing the output. For example, all the current flowing through input stage 10 flows through resistor 26. If the voltage at terminal 28 exceeds that of terminals 34 and 36, more of the current flowing through resistor 26 will flow through transistor 24 than flows through resistor 22, and the voltage at node 30 will fall. Conversely, if the voltage at either of terminals 34 and 36 exceeds that at terminal 28, then more of the current flowing through resistor 26 will flow through resistor 22 and one or more of transistors 16 and 18 than flows through resistor 24 and reference transistor 20. In this case, the voltage at node 30 will rise. Thus, input stage 10 functions as a two input OR gate.

Current mirror circuit 12 includes NPN transistor 44 and diode coupled NPN transistor 46. NPN transistor 44 has a collector coupled to node 32 and an emitter coupled to terminal 48 which may be in turn coupled to a second source of supply voltage ($V_{EE}$). Transistor 46 has a base and collector terminal coupled to the base of transistor 44 and, via resistor 50, to terminal 42. In this manner, the current flowing through input stage 10 ($I_I$) is mirrored from current $I_3$ flowing through resistor 50 and into the current mirror circuit.

Output stage 14 includes NPN transistor 52, NPN transistor 54 and resistor 56. Output terminal 58 is coupled to the junction between the emitter of transistor 52 and the collector of transistor 54. Transistor 52 has a collector coupled to power supply terminals 42 and a base coupled to node 30 and input stage 10. Transistor 54 has an emitter coupled to power supply terminal 48 via resistor 56. The base terminal of transistor 54 is coupled to terminal 60 which may in turn be coupled to a bias voltage ($V_{CS}$) chosen so as to keep transistor 54 conducting at a desired level.

Transistor 54 represents a constant current source. Therefore, the current flowing through transistor 52 is constant. Since the voltage at the base of transistor 52 which is coupled to node 30 is rising or falling depending on the relative magnitudes of the signals at terminals 28, 34, and 36, the voltage at the emitter of transistor 52 and therefore at output terminal 58 will rise and fall following the voltage at the base of transistor 52.

A disadvantage of the circuit shown in FIG. 1 should be apparent. That is, a defined current $I_3$ will always flow through resistor 50 thus consuming power.

Figure 2:
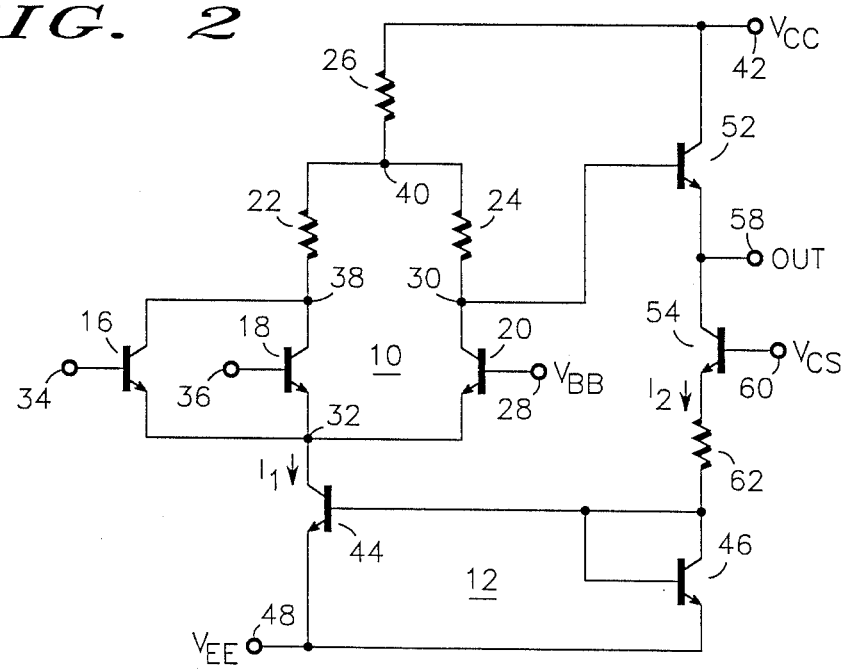
FIG. 2 is a schematic diagram of the inventive ECL logic gate.

FIG. 2 is a schematic diagram of the inventive logic gate. As can be seen, the circuit still comprises an input stage 10 and current mirror circuit 12, and like elements have been denoted with like reference numerals In contrast, however, while the circuit of FIG. 1 contained three current paths from $V_{CC}$ to $V_{EE}$, the circuit in FIG. 2 has only two. That is, the current mirror transistor 46 has been placed in the same current path as the emitter follower output stage including transistors 52 and 54. Resistors 50 and 56 appearing on FIG. 1 are now replaced by a resistor 62 coupled in series between the emitter of transistor 54 and current mirror transistor 46.

Generally, the circuit functions in the same manner as that shown in FIG. 1. That is, transistor 54 having an emitter coupled to resistor 62 and thereafter to diode coupled transistor 46 represents a constant current source. Therefore, the current flowing through transistor 52 is constant. Since the voltage at the base of transistor 52 which is coupled to node 30 is rising or falling depending on the relative magnitudes of the signals at terminals 28, 34 and 36, the voltage at the emitter and therefore at output terminal 58 will rise and fall following the voltage at the base of transistor 52.

Therefore, not only has power consumption been reduced by eliminating the current path comprised of resistor 50 and transistor 46 in FIG. 1, but the component count per gate has also been substantially reduced. When used on an array containing as many as, for example, 10,000 gates, the reduction in power and components becomes significant.

The above description is given by way of example only. Changes in form and details may be made by one skilled in the art without departing from the scope of the invention as defined by the appended claims.

We claim:

1. A logic gate, comprising:
   an input stage having a plurality of inputs and a first output;
   an output stage coupled to said first output; and
   current mirror means having first and second current paths for producing in said first current path a current which is a function of the current flowing in said second current path, said input stage coupled in series with said first current path, and said output stage coupled in series with said second current path.

2. A logic gate, comprising:
   an input stage having a plurality of inputs and a first output;
   an output stage coupled to said first output; and
   current mirror means having first and second current paths for producing in said first current path a current which is a function of the current flowing in said second current path said input stage coupled in series with said first current path, and said output stage coupled in series with said second current path;
   wherein said output stage includes,
   (a) a first transistor having a base coupled to said first output, a collector coupled to a first power supply terminal, and having an emitter;
   (b) a second transistor having a base coupled to a first reference voltage terminal, a collector coupled to said emitter of said first transistor, and having an emitter; and
   (c) resistor means coupled between said emitter of said second transistor and second current path of said current mirror means.

3. A logic gate according to claim 2 wherein said current mirror means comprises:
   a third transistor having a collector coupled to said input stage, an emitter coupled to a second supply voltage terminal and having a base; and
   diode means having a first terminal coupled to the base of said third transistor and to said resistor means and having a second terminal coupled to said second supply voltage terminal.

4. A logic gate according to claim 3 wherein said diode means comprises a fourth transistor having base and collector terminals coupled to the base of said third transistor and said resistor means and having an emitter coupled to said second supply voltage terminal.

5. A logic gate according to claim 3 wherein said input stage comprises:
   a reference transistor having a base coupled to a second reference voltage terminal, an emitter coupled to the collector of said third transistor and having a collector;
   at least first and second input transistors each having an emitter coupled to the collector of said third transistor, a base coupled to one of first and second input terminals, and each having a collector;
   a second resistive means coupled between said first supply voltage terminal and the collectors of said first and second input transistors; and
   a third resistive means coupled between said first supply voltage terminal and the collector of said reference transistor.

* * * * *

REEXAMINATION CERTIFICATE (1773rd)

United States Patent [19]

Hollstein et al.

[11] B1 4,871,929

[45] Certificate Issued  Aug. 18, 1992

[54] ECL LOGIC GATE

[75] Inventors: Roger L. Hollstein, Phoenix; M. Ngheim Phan, Mesa, both of Ariz.

[73] Assignee: Motorola Inc.

Reexamination Request:
No. 90/002,551, Feb. 10, 1992

Reexamination Certificate for:
Patent No.: 4,871,929
Issued: Oct. 3, 1989
Appl. No.: 215,978
Filed: Jul. 7, 1988

[51] Int. Cl.⁵ ............... H03K 19/013; H03K 19/086; H03K 19/0175; H03K 17/04
[52] U.S. Cl. ................. 307/455; 307/362; 307/475
[58] Field of Search ........... 307/455, 475, 362, 440, 307/355, 296.9; 330/261

[56] References Cited

U.S. PATENT DOCUMENTS

| | | | |
|---|---|---|---|
| 3,836,853 | 9/1974 | Cracraft et al. | 307/362 |
| 4,092,611 | 5/1978 | Frederiksen et al. | 330/261 |
| 4,272,728 | 6/1981 | Wittlinger | 330/261 |
| 4,713,560 | 12/1987 | Herndon | 307/455 |
| 4,928,025 | 5/1990 | Kokado | 307/355 |

*Primary Examiner*—John Zazworsky

[57] ABSTRACT

An ECL logic gate includes an input stage, an output stage, and a multifunction current mirror circuit. The input stage includes a plurality of input transistors, a reference transistor, and an output which indicates the relative conductivities of said reference transistor as compared to one or more of the input transistors. This output is coupled to the output stage. A current mirror circuit having first and second current paths is provided in which the input stage is coupled in series with the first current path, and the output stage is coupled in series with the second current path.

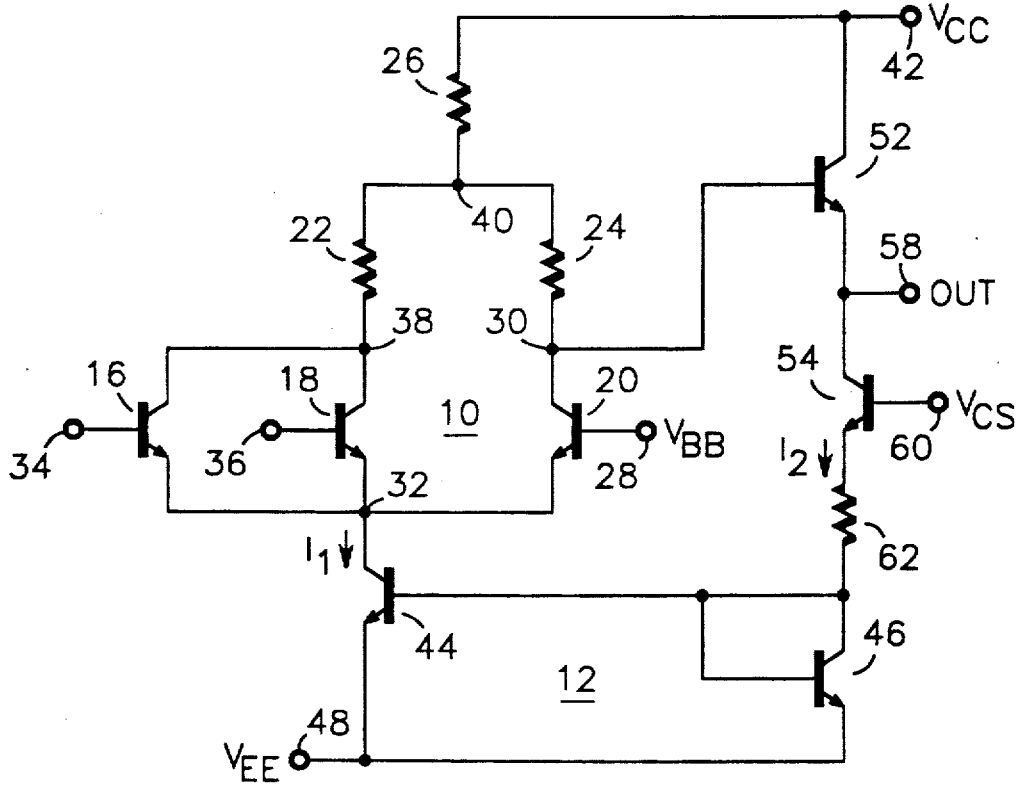

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 2-5 are confirmed.

Claim 1 is cancelled.

2. A logic gate, comprising:
an input stage having a plurality of inputs and a first output;
an output stage coupled to said first output; and
current mirror means having first and second current paths for producing in said first current path a current which is a function of the current flowing in said second current path said input stage coupled in series with said first current path, and said output stage coupled in series with said second current path;
wherein said output stage includes,
 (a) a first transistor having a base coupled to said first output, a collector coupled to a first power supply terminal, and having an emitter;
 (b) a second transistor having a base coupled to a first reference voltage terminal, a collector coupled to said emitter of said first transistor, and having an emitter; and
 (c) resistor means coupled between said emitter of said second transistor and second current path of said current mirror means.

* * * * *